United States Patent
Adachi et al.

[19]

[11] Patent Number: 6,151,348
[45] Date of Patent: Nov. 21, 2000

[54] SEMICONDUCTOR LASER

[75] Inventors: Hideto Adachi, Ibaraki; Isao Kidoguchi, Kawanishi; Yasuhito Kumabuchi, Toyonaka, all of Japan

[73] Assignee: Matsushita Electric Industrial Co., Ltd., Osaka, Japan

[21] Appl. No.: 09/142,424
[22] PCT Filed: Mar. 3, 1997
[86] PCT No.: PCT/JP97/00643
 § 371 Date: Nov. 17, 1998
 § 102(e) Date: Nov. 17, 1998
[87] PCT Pub. No.: WO97/33351
 PCT Pub. Date: Sep. 12, 1997

[30] Foreign Application Priority Data

Mar. 4, 1996 [JP] Japan .................................. 8-045761

[51] Int. Cl.$^7$ ........................................................ H01S 3/19
[52] U.S. Cl. ................................................................ 372/45
[58] Field of Search ................................................ 372/45

[56] References Cited

U.S. PATENT DOCUMENTS 5,416,790 5/1995 Yodoshi et al. .

FOREIGN PATENT DOCUMENTS

| 63-202083 | 8/1988 | Japan . |
| 6-260716 | 9/1994 | Japan . |
| 7-22695 | 1/1995 | Japan . |
| 9-83064 | 3/1997 | Japan . |

OTHER PUBLICATIONS

International Search Report dated Jul. 15, 1997 for International Application No. PCT/JP97/00643.
R. C. P. Hoskens et al., "Self–pulsating lasers with quantum well saturable absorber", APPL. PHYS. LETT. 67, No. 10, pp. 1343–1345, 1995.
Hideto Adachi et al., "Self–Sustained Pulsation in 650–nm–Band A1GaInP Visible–Laser Diodes with Highly Doped Saturable Absorbing Layer", IEEE Photonics Technology Letters, No. 12, vol. 7, pp. 1406–1408, Dec. 1995.
T. Fukuhisa et al., "Self–Sustained Pulsation in 650 nm–Band Laser Diodes with Highly Doped Saturable Absorbing Layer", 1995 Autumn—The 56$^{th}$ Applied Physics Conference Preliminary Report, vol.3, 26p–ZA–6, 1995.
H. Adachi et al., "Design of Self–Sustained Pulsation Laser Diodes with Saturable Absorbing Layer", 1995 Autumn—The 56$^{th}$ Applied Physics Conference Preliminary Report, vol. 3, 26p–AA–5, 1995.

*Primary Examiner*—Frank G. Font
*Assistant Examiner*—Gioacchino Inzirillo
*Attorney, Agent, or Firm*—Ratner & Prestia

[57] ABSTRACT

A semiconductor laser includes at least an active layer and a saturable absorbing layer, and a compressive strain amount in the saturable absorbing layer is set to be greater than a value of compressive strain in the active layer by about 0.3% or more. Alternatively, a semiconductor laser includes at least an active layer, a saturable absorbing layer, and a light guiding layer disposed in the vicinity of the saturable absorbing layer; and a compressive strain amount in the saturable absorbing layer is greater than a value of compressive strain in the active layer by about 0.3% or more.

18 Claims, 13 Drawing Sheets

ND PATENT

SEMICONDUCTOR LASER

This application is a U.S. National Phase Application of PCT International Application PCT/JP97/00643.

TECHNICAL FIELD

The present invention relates to a low-noise self-pulsation type semiconductor laser which is used as a light source for an optical pick up contained in an optical disk system, or the like.

BACKGROUND ART

Recently, demands for semiconductor lasers have been increasing in areas such as optical communication, laser printers, and optical disks, and vigorous studies and developments have been made mainly on GaAs type and InP type semiconductor lasers. In the area of optical information processing, a method in which recording and reproduction of information are performed by means of AlGaAs type semiconductor laser light having a wavelength of about 780 nm, in particular, has been put into practice, and the use of such a method has been wide-spread for compact disks or the like. In recent years, however, there is a demand for greater storage capacity in these optical disk apparatuses, and accordingly, demand for realizing a short-wavelength laser has been increasing.

In this respect, the AlGaInP type semiconductor laser is capable of oscillating in the red region of about 630 nm to about 690 nm. At present, the AlGaInP type semiconductor laser can realize the shortest wave-length of light among semiconductor lasers at the practical level. Therefore, the AlGaInP type semiconductor laser is expected to be the next-generation light source for recording mass optical information, replacing the conventional AlGaAs type semiconductor laser.

Upon reproducing an optical disk by employing a semiconductor laser as a light source, an intensity noise occurs due to the return of reflected light from the disk surface or a change in temperature. Such an intensity noise induces the reading error of a signal. Therefore, as the light source for an optical disk, a semiconductor laser having less intensity noise is essential.

Conventionally, in a low-output AlGaAs type semiconductor laser which is used as a light source for a reproduction only optical disk, low noise has been realized by employing the structure such that saturable absorbers are intentionally formed at both sides of a ridge stripe in order to reduce noise. With such a structure, multiple longitudinal modes are achieved. In the case where disturbance occurs due to returning light, a temperature change, or the like, when a semiconductor laser is oscillating in a single-longitudinal mode, an adjacent longitudinal mode starts to oscillate due to a subtle change in a gain peak. The mode which starts oscillating in such a manner competes with the original oscillation mode, thereby causing a noise. On the other hand, if multiple longitudinal modes are realized by using the aforementioned method, changes in intensities for the respective modes are averaged, and no intensity changes due to disturbance occur. Therefore, it becomes possible to obtain stable low-noise characteristics.

Moreover, as another method, Japanese Laid-open Publication No. 63-202083 describes an attempt to realize more stable self-pulsation characteristics. Specifically, a self-pulsation type semiconductor laser is realized by providing a layer capable of absorbing output light.

Furthermore, Japanese Laid-open Publication No. 6-260716 has reported that operating characteristics of the semiconductor laser is improved by substantially equalizing the bandgap of an active layer with the bandgap of an absorbing layer. The aforementioned publication especially discloses the structure in which the energy gap of a strained quantum-well active layer and the bandgap of a strained quantum-well saturable absorbing layer are set to be substantially equal to each other. With such a structure, it is attempted to obtain satisfactory self-pulsation characteristics.

Furthermore, the same structure as that of Japanese Laid-open Publication No. 6-260716 is described in Japanese Laid-open Publication No. 7-22695.

DISCLOSURE OF THE INVENTION

A semiconductor laser of the present invention includes at least an active layer and a saturable absorbing layer, and a compressive strain amount in the saturable absorbing layer is greater than a value of compressive strain in the active layer by about 0.3% or more.

The saturable absorbing layer may be of p-type conductivity.

In one example, a cladding layer provided between the active layer and the saturable absorbing layer is further included, and a bandgap of the cladding layer is greater than a bandgap of the active layer and that of the saturable absorbing layer. A thickness of the cladding layer is, for example, about 900 angstroms or more.

An impurity concentration of the saturable absorbing layer may be at least about $1\times10^{18}$ cm$^{-3}$.

According to another aspect of the present invention, a semiconductor laser includes at least an active layer, a saturable absorbing layer, and a light guiding layer disposed in the vicinity of the saturable absorbing layer, and a compressive strain amount in the saturable absorbing layer is greater than a value of compressive strain in the active layer by about 0.3% or more.

In one example, the active layer, the saturable absorbing layer, and the light guiding layer are disposed in this order. Alternatively, the active layer, the light guiding layer, and the saturable absorbing layer are disposed in this order. In such a case, the aforementioned value such that "a thickness of the cladding layer is about 900 angstroms or more" includes the thickness of the light guiding layer disposed between the active layer and the saturable absorbing layer. Therefore, in a strict sense, it means that "the sum of the thickness of the cladding layer and the thickness of the light guiding layer is about 900 angstroms or more".

The active layer may have a strained quantum-well structure; and the saturable absorbing layer may be a strained quantum-well layer having compressive strain in an amount greater than a value of compressive strain in the active layer by about 0.3% or more.

The saturable absorbing layer may be of p-type conductivity, and may be disposed in a p-type cladding layer.

In one example, a cladding layer provided between the active layer and the saturable absorbing layer is further included, and a bandgap of the cladding layer is greater than a bandgap of the active layer and that of the saturable absorbing layer.

A thickness of the cladding layer may be about 900 angstroms or more.

An impurity concentration of the saturable absorbing layer may be at least about $1\times10^{18}$ cm$^{-3}$.

Accordingly, the present invention aims at providing a semiconductor laser having stable self-pulsation characteristics especially when operated at a high temperature by suitably setting strain amount of a saturable absorbing layer included in the semiconductor laser, or suitably providing an light guiding layer which determines light confinement rate.

BEST MODE FOR CARRYING OUT THE INVENTION

Before specifically describing examples of the present invention, results of studies made by the inventors of the present application in the course of arriving at the present invention will be described hereinafter.

As described above, in the prior art, various reports have been made regarding utilization of self-pulsation phenomenon in a semiconductor laser. According to studies made by the inventors of the present application, however, it has been revealed that it is difficult to obtain self-pulsation characteristics in the AlGaInP type semiconductor laser since the gain characteristics curve of the material significantly varies from that of the AlGaAs type semiconductor laser. This will be described with reference to FIG. 13.

Figure 13:
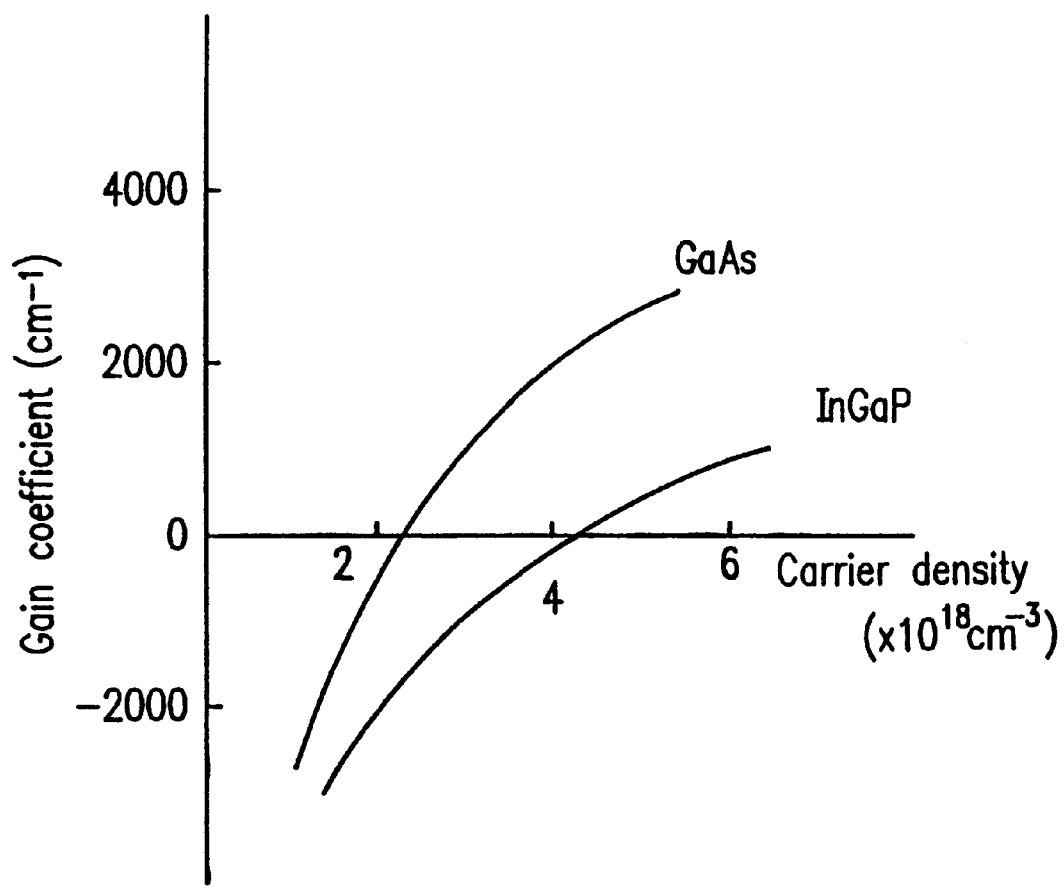
FIG. 13 is a diagram showing gain characteristics of GaAs and InGaP.

FIG. 13 is a diagram showing gain characteristics of GaAs and InGaP. These materials (i.e., GaAs and InGaP) are mainly used as constituent materials for active layers in the AlGaAs type semiconductor laser and the AlGaInP type semiconductor laser, respectively.

According to the studies made by the inventors of the present application, it has been revealed that self-pulsation characteristics can be obtained more easily as the slope of gain characteristics curve with respect to a carrier density becomes steeper. The reason relates to the fact that strong carrier oscillation inside a saturable absorbing layer is required in order to obtain self-pulsation characteristics. Greater slope of gain characteristics curve with respect to a carrier density makes it possible to change carrier density with less light absorption. Consequently, carrier oscillation is more likely to occur.

In the case of InGaP, however, it has been revealed that since InGaP exhibits a smaller slope as compared to GaAs, it is relatively difficult to obtain self-pulsation characteristics. This is based on the fact that high derivative gain of InGaP induces strong carrier oscillation. On the other hand, in an AlGaAs type laser diode (LD), for example, it is possible to readily obtain stable self-pulsation characteristics.

According to the results of studies made by the inventors of the present application, in the case of red semiconductor laser, it has been revealed that it is difficult to obtain stable self-pulsation characteristics simply by adding a saturable absorbing layer in the same manner as in the prior art. Specifically, as described above, control for gain characteristics of the saturable absorbing layer becomes critical in the AlGaInP type semiconductor laser.

Accordingly, the inventors of the present application realized an improvement in self-pulsation characteristics during operation at a high temperature by especially studying the strain amount in the saturable absorbing layer. In addition, it has been newly found that, in the laser having such satisfactory gain characteristics, increasing the coefficient of light confinement into the saturable absorbing layer has a great influence in realizing further improvement in such characteristics.

Specifically, according to the studies made by the inventors of the present application, compressive strain in an amount which is greater than the compressive strain amount being applied to the active layer by about 0.3% or more may be applied to the saturable absorbing layer in order to optimize gain characteristics of the saturable absorbing layer. It has been found that with such a setting, self-pulsation can be sufficiently maintained even during operation at a high temperature. The reason is as follows. By introducing a suitable level of compressive strain, gain rapidly changes in response to a carrier density change inside the saturable absorbing layer. As a result, the oscillating component of carrier increase and decrease in the saturable absorbing layer becomes intense, thereby intensifying interaction between photon and carrier in the active layer and the saturable absorbing layer.

In the case where the amount of compressive strain to be introduced is smaller than the above-described setting, it becomes difficult to obtain sufficient self-pulsation characteristics in the type of materials essentially having low gain characteristics such as AlGaInP type material. If the amount of compressive strain to be introduced is too large, on the other hand, crystal quality is degraded, resulting in a negative influence on reliability. The upper limit of the compressive strain amount is about 2.0% irrespective of application of strain to the active layer. If compressive strain in an amount greater than about 2.0% is applied, problems such as occurrence of dislocation in the saturable absorbing layer become prominent.

The amount of strain applied to the saturable absorbing layer according to the present invention will be further described.

According to the present invention, strain is applied to the saturable absorbing layer such that the saturable absorbing layer is compressed against the active layer. For example, in the case where compressive strain has been already applied to the active layer, compressive strain in an amount which is greater than the compressive strain amount being applied to the active layer by about 0.3% or more is applied to the saturable absorbing layer.

On the other hand, in the case where tensile strain is being applied to the active layer, it is possible to satisfy the aforementioned condition either by applying compressive strain to the saturable absorbing layer or by applying tensile strain thereto. In other words, for the active layer to which tensile strain is being applied, when tensile strain in an amount which is smaller than the tensile strain being applied to the active layer is applied to the saturable absorbing layer, compressive strain is applied to the saturable absorbing layer. Therefore, by setting a difference between strain amounts to be applied to the saturable absorbing layer and the active layer to be a suitable amount, the aforementioned condition is satisfied also by the application of tensile strain.

In the case where the active layer has a strained quantum-well structure, it is necessary to apply strain in an amount greater than the strain amount of the strained quantum-well structure by about 0.3% or more to the saturable absorbing layer. This is for the purpose of producing a sufficient light absorption effect in the saturable absorbing layer.

Accordingly, when the compressive strain amount in the active layer is 0%, the amount of compressive strain to be applied to the saturable absorbing layer is at least about 0.3%. Alternatively, if the compressive strain amount in the active layer is about 0.5%, the amount of compressive strain to be applied to the saturable absorbing layer is at least about 0.8%.

Moreover, according to the present invention, light confinement rate (light-confinement coefficient) is defined by providing a light confinement layer.

Self-pulsation characteristics are greatly influenced by light confinement state in the active layer and the saturable absorbing layer. Especially, if light confinement in the saturable absorbing layer is not sufficiently large, it is impossible to obtain stable self-pulsation characteristics. On the other hand, however, if the level of light confinement in the saturable absorbing layer is excessively increased, the level of light confinement in the active layer is excessively reduced. As a result, a driving current is increased, thereby inversely affecting the reliability.

According to the semiconductor laser of the present invention, in order to further improve self-pulsation characteristics during operation at a high temperature, the level of light confinement in the saturable absorbing layer is increased by introducing a light guiding layer. According to the study made this time by the inventors of the present application, it has been revealed that self-pulsation characteristics are improved by providing the light guiding layer between the active layer and the strained saturable absorbing layer. Specifically, it has been revealed that the level of light confinement in the saturable absorbing layer can be further increased without reducing the level of light confinement in the active layer by arranging the active layer, the saturable absorbing layer, and the light guiding layer in this order.

When the light guiding layer is provided between the active layer and the saturable absorbing layer, overflow of carriers from the active layer to the light guiding layer may occur since the light guiding layer has a low Al composition and a small bandgap. However, according to the present invention, as described above, by arranging the light guiding layer in a position further away from the active layer than the saturable absorbing layer, such carrier overflow and adverse effects accompanying therewith can be reduced. As a result, it is possible to realize stable self-pulsation characteristics even at a high temperature of about 60° C. or greater.

Figure 1:
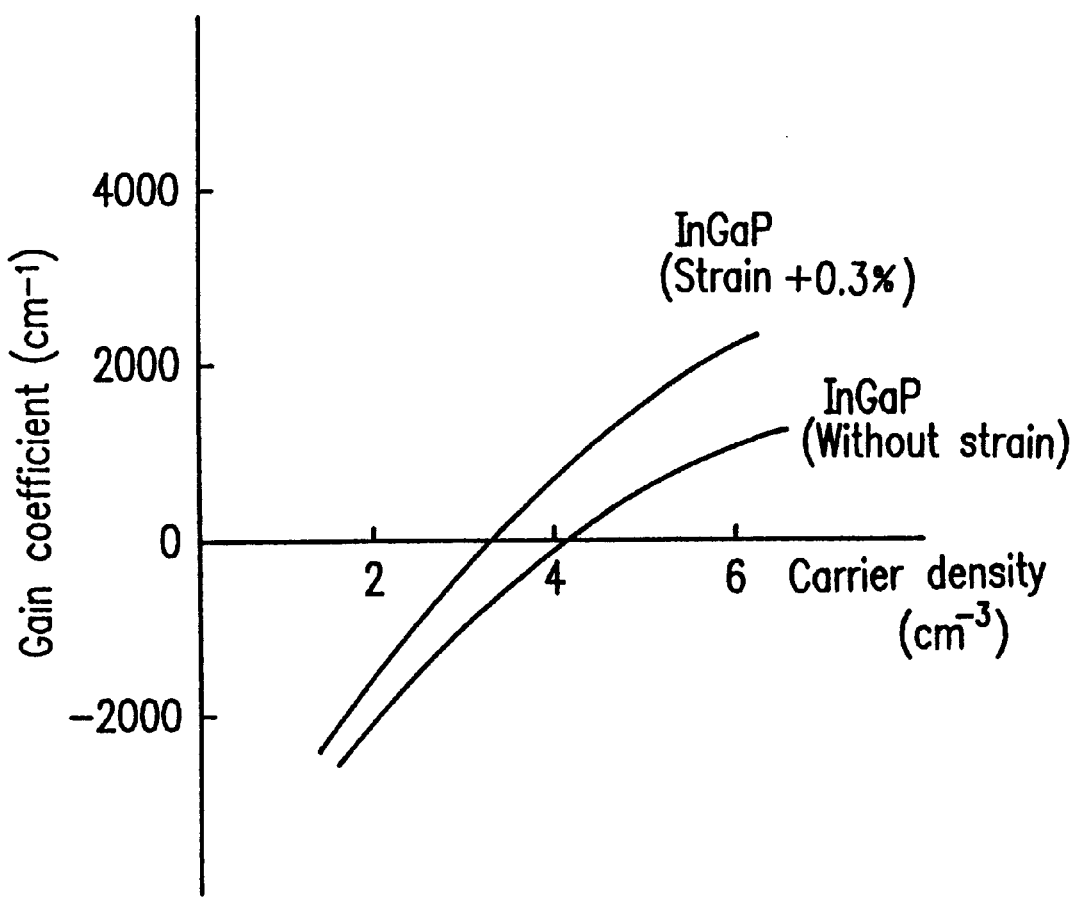
FIG. 1 is a view for explaining how the existence of compressive strain introduced into an InGaP layer influences gain characteristics of a semiconductor laser.

FIG. 1 shows gain characteristics (that is, changes in a gain coefficient with respect to a carrier density) respectively in an InGaP layer having no strain and an InGaP layer having strain. From this figure, it is recognized that the slope of gain characteristics curve (i.e., derivative gain) is increased along with the application of strain. Such an increase in a derivative gain induces strong oscillation with respect to a change in a carrier density, resulting in intensifying self-pulsation phenomenon.

In the conventional self-pulsation type semi-conductor laser, the introduction of such strain amount into the saturable absorbing layer is not considered at all. For example, in the specification of the present application, several publications disclosing exemplary structures of conventional self-pulsation type semiconductor lasers are cited. In these publications, however, there is no description regarding the introduction of strain amount as described above.

Moreover, according to the prior art, it is said that self-pulsation is generated simply by introducing the saturable absorbing layer having the bandgap substantially equal to that of the active layer in the cladding layers provided at both sides of the active layer of the semiconductor laser. According to the studies made by the inventors of the present application, however, it has been revealed that in reality it is difficult to realize self-pulsation type laser simply by providing such a saturable absorbing layer. Specifically, as described above, according to the experiment by the inventors of the present application, it has been revealed that it is extremely difficult to generate self-pulsation phenomenon just by making the bandgap of the saturable absorbing layer substantially equal to the bandgap of the active layer.

Accordingly, in consideration of the contents as described above, the inventors of the present application suggest the optimum structure for the self-pulsation type semiconductor laser based on experiments.

Hereinafter, some of various examples of the present invention which were achieved based on the results of studies as described above will be described with reference to the accompanying drawings.

EXAMPLE 1

Figure 2:
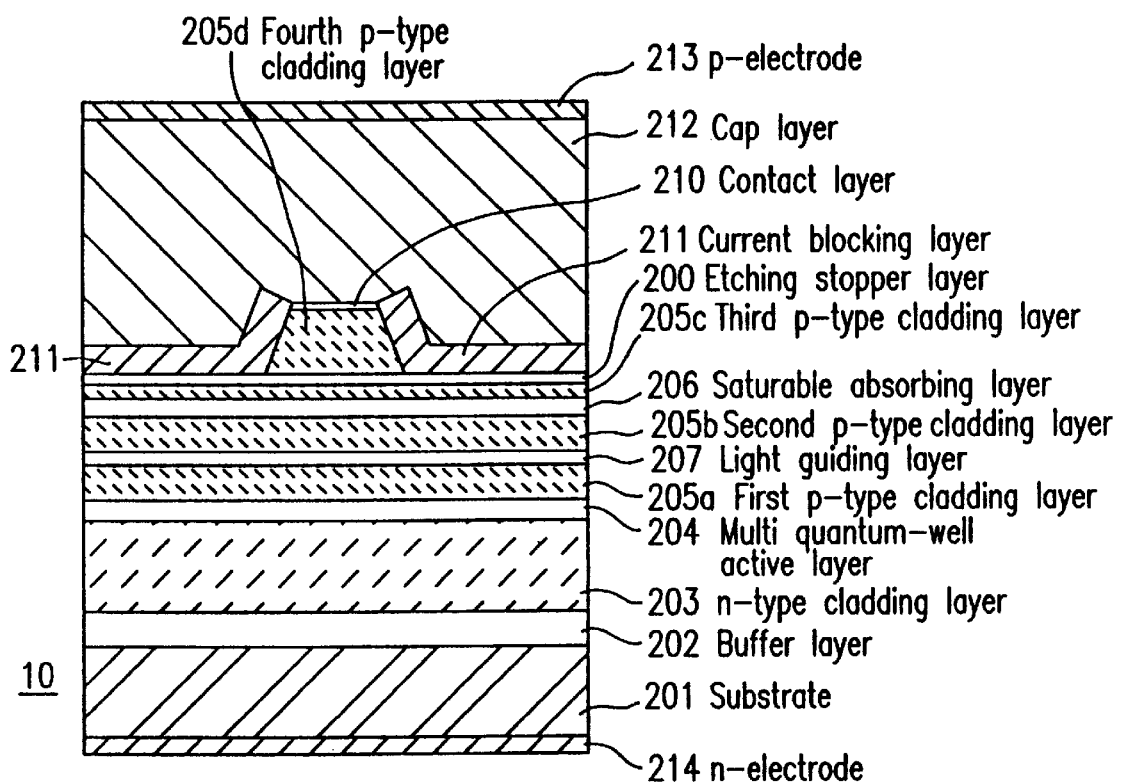
FIG. 2 is a cross-sectional view showing the structure of a semiconductor laser according to Example 1 of the present invention.

FIG. 2 is a cross-sectional view showing the structure of a semiconductor laser 10 having self-pulsation characteristics according to Example 1 of the present invention.

In the semiconductor laser 10, an n-type InGaP buffer layer 202, an n-type AlGaInP cladding layer 203, a multi quantum-well active layer 204 containing an InGaP well layer and an AlGaInP barrier layer, a first p-type cladding layer 205*a* made of p-type AlGaInP, a p-type AlGaInP light guiding layer 207, a second p-type cladding layer 205*b* made of p-type AlGaInP, a p-type InGaP strained quantum-well saturable absorbing layer 206, a third p-type cladding layer 205*c* made of p-type AlGaInP, and a p-type InGaP etching stop layer 200 are sequentially formed on an n-type GaAs substrate 201. A fourth p-type cladding layer 205d made of p-type AlGaInP and a p-type InGaP contact layer 210 are formed in a ridge shape on the p-type InGaP etching stop layer 200. At both sides of the ridge, n-type GaAs current blocking layers 211 are formed. Moreover, a p-type GaAs cap layer 212 is formed on the p-type contact layer 210 and the n-type current blocking layer 211. A p-electrode 213 is formed on the cap layer 212, whereas an n-electrode 214 is formed on the bottom surface of the substrate 201.

Typical doping amount, thickness, and strain amount to be applied in each of the aforementioned layers are as follows.

TABLE 1

| Name | Reference numeral | Doping amount | Layer thickness | Strain amount |
|---|---|---|---|---|
| Cap layer | 212 | $5 \times 10^{18}$ (cm$^{-3}$) | 3 μm | None |
| Third p-type cladding layer | 205c | $1 \times 10^{18}$ (cm$^{-3}$) | 0.9 μm | None |
| Etching stop layer | 200 | $5 \times 10^{17}$ (cm$^{-3}$) | 100 Å | None |
| Second p-type cladding layer | 205b | $5 \times 10^{17}$ (cm$^{-3}$) | 1350 Å | None |
| Strained quantum-well saturable absorbing layer | 206 | $2 \times 10^{18}$ (cm$^{-3}$) | 150 Å | 0.8% |
| First p-type cladding layer | 205a | $5 \times 10^{17}$ (cm$^{-3}$) | 900 Å | None |
| Active layer | 204 | Undoped | 500 Å | 0.5% |
| n-type cladding layer | 203 | $5 \times 10^{17}$ (cm$^{-3}$) | 1.0 μm | None |
| Buffer layer | 202 | $1 \times 10^{18}$ (cm$^{-3}$) | 0.3 μm | None |

Figure 3:
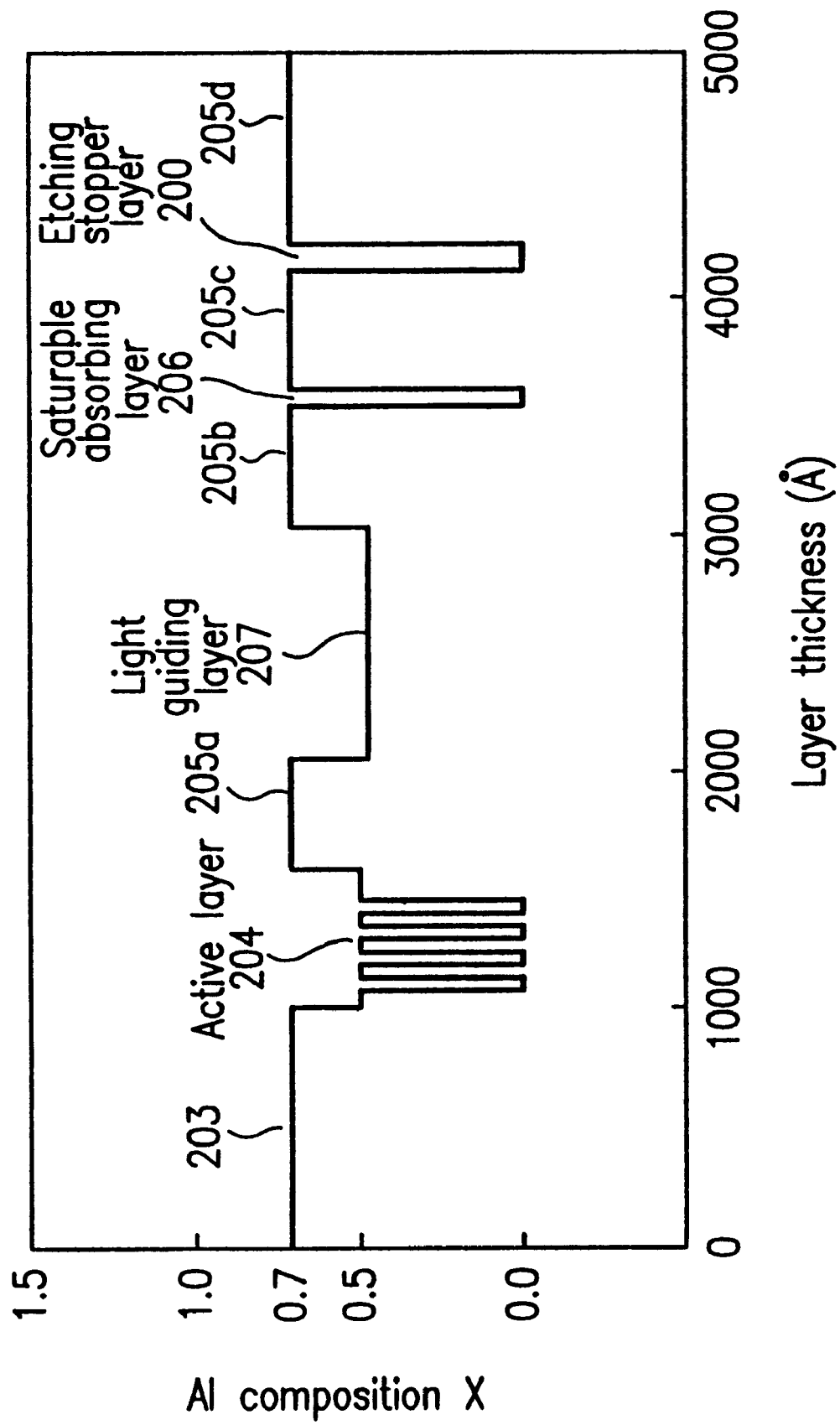
FIG. 3 is a diagram showing changes in Al composition in an active layer and the vicinity thereof in the semiconductor laser according to Example 1 of the present invention.

FIG. 3 shows changes in Al composition x of $(Al_xGa_{1-x})_{0.5}In_{0.5}P$ in the active layer 204 and the vicinity thereof in the semiconductor laser 10. As shown in the figure, the Al composition x in the n-type cladding layer 203 and the first to the fourth p-type cladding layers 205a to 205d is set to be 0.7 in the semiconductor laser 10.

Also, as shown in the previous table, the thickness of the saturable absorbing layer 206 is set to be about 150 Å in the semiconductor laser 10. When the saturable absorbing layer 206 has a large thickness, the volume thereof becomes too large. As a result, a carrier density thereof becomes relatively small. Therefore, the effect of oscillation in carrier density is reduced, and thus it becomes difficult to obtain self-pulsation characteristics. Thus, the thinner saturable absorbing layer 206 is preferable.

Moreover, an impurity concentration (doping amount) in the saturable absorbing layer 206 of the semiconductor laser 10 is set to be about $2 \times 10^{18}$ cm$^{-3}$. This is for reducing the lifetime of carriers inside the saturable absorbing layer 206.

Specifically, the shorter the lifetime of a carrier inside the saturable absorbing layer 206 is, the greater the change in a carrier density of the saturable absorbing layer 206 with time necessary to generate self-pulsation phenomenon becomes. Consequently, self-pulsation phenomenon becomes more likely to occur. According to the experiment by the inventors of the present application, carrier lifetime inside the saturable absorbing layer 206 is preferably about 6 nanoseconds or less in order to generate self-pulsation phenomenon. In general, a lower impurity concentration leads to a longer carrier lifetime, and a higher impurity concentration leads to a shorter carrier lifetime. By increasing an impurity concentration (doping level) of the saturable absorbing layer 206 to the level of about $1 \times 10^{18}$ cm$^{-3}$, carrier lifetime therein can be reduced.

According to the semiconductor laser 10, the thickness of the first p-type cladding layer 205a is set to be about 900 Å. In addition, the bandgap of the first p-type cladding layer 205a is set to be larger than the bandgaps of the active layer 204 and the saturable absorbing layer 206 so as to prevent minority carrier overflow from the active layer 204 from entering the saturable absorbing layer 206. Furthermore, the strain amount in the saturable absorbing layer 206 is set to be about 0.8%.

With the setting as described above, according to the semiconductor laser 10, self-pulsation characteristics can be obtained as long as the coefficient of light confinement into the saturable absorbing layer 206 is about 3% or more.

Figure 4:
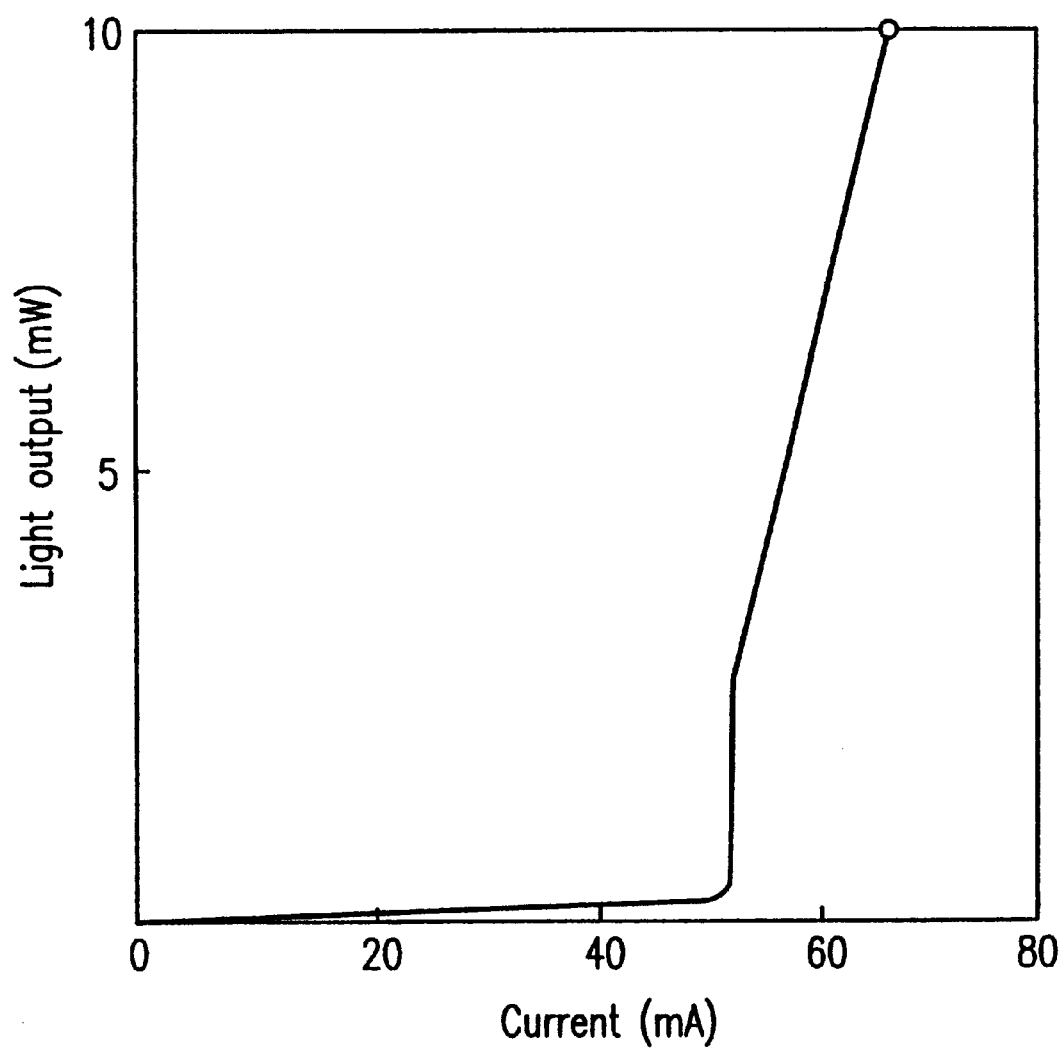
FIG. 4 is a diagram showing current-light output characteristics in the semiconductor laser according to Example 1 of the present invention.

FIG. 4 shows an exemplary measurement of current-light output characteristics in the self-pulsation type semiconductor laser 10 of this example. In this case, it can be seen that the threshold current is about 50 mA. As shown in FIG. 4 as well, current-light output characteristics of the self-pulsation type semiconductor laser differs from the characteristics of the general semiconductor laser in that the characteristics curve thereof rapidly rises in the vicinity of the threshold current. This is because light output is not emitted outside until some level of carrier injection is achieved due to the presence of the saturable absorbing layer in the self-pulsation type semiconductor laser. When carrier injection amount exceeds a certain value, laser oscillation occurs, thereby increasing light output in proportion to the amount of injected current.

Figure 5:
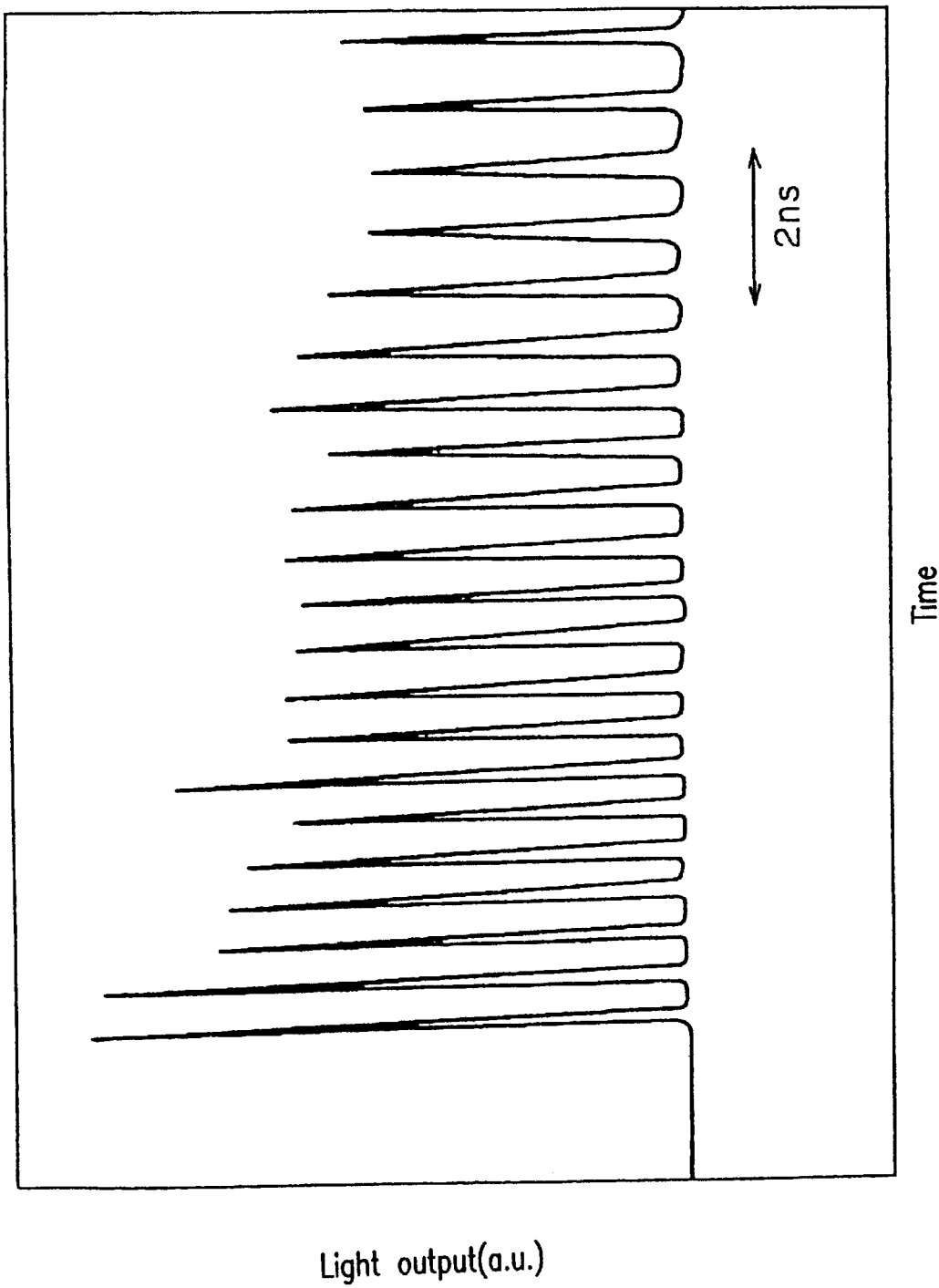
FIG. 5 is a diagram showing how light output changes with time in the semiconductor laser according to Example 1 of the present invention.

FIG. 5 shows an exemplary measurement of a light output waveform in the self-pulsation type semiconductor laser 10 of this example. It can be recognized that light output greatly oscillates with the elapse of time, thereby causing self-pulsation.

Figure 6A:
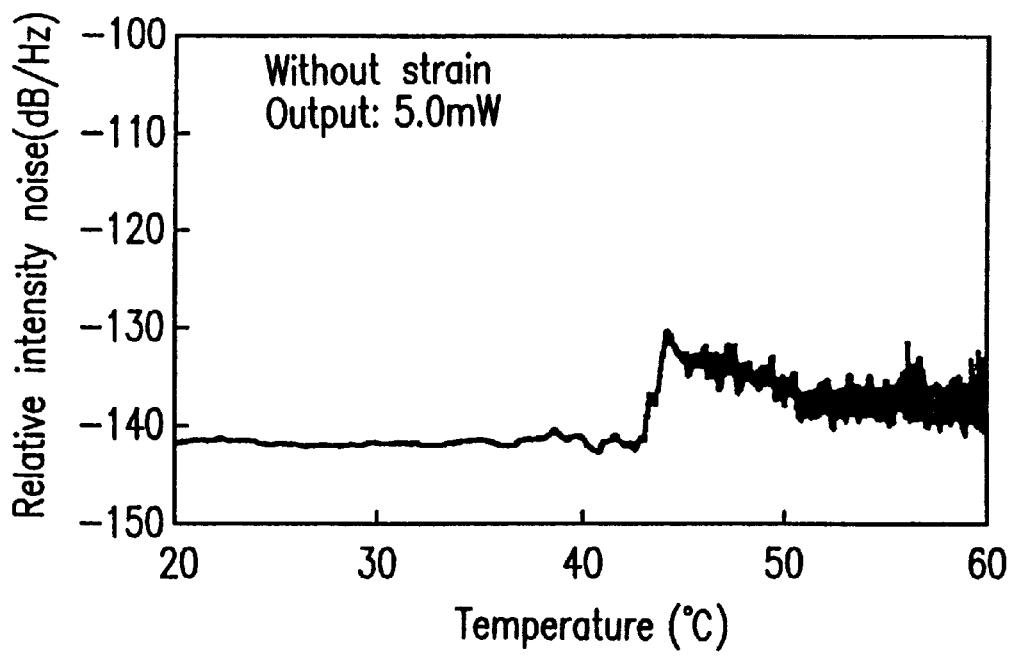
FIGS. 6A and 6B are diagrams for explaining how the existence of compressive strain introduced into a saturable absorbing layer influences relative intensity noise characteristics of the semiconductor laser.
Figure 6B:
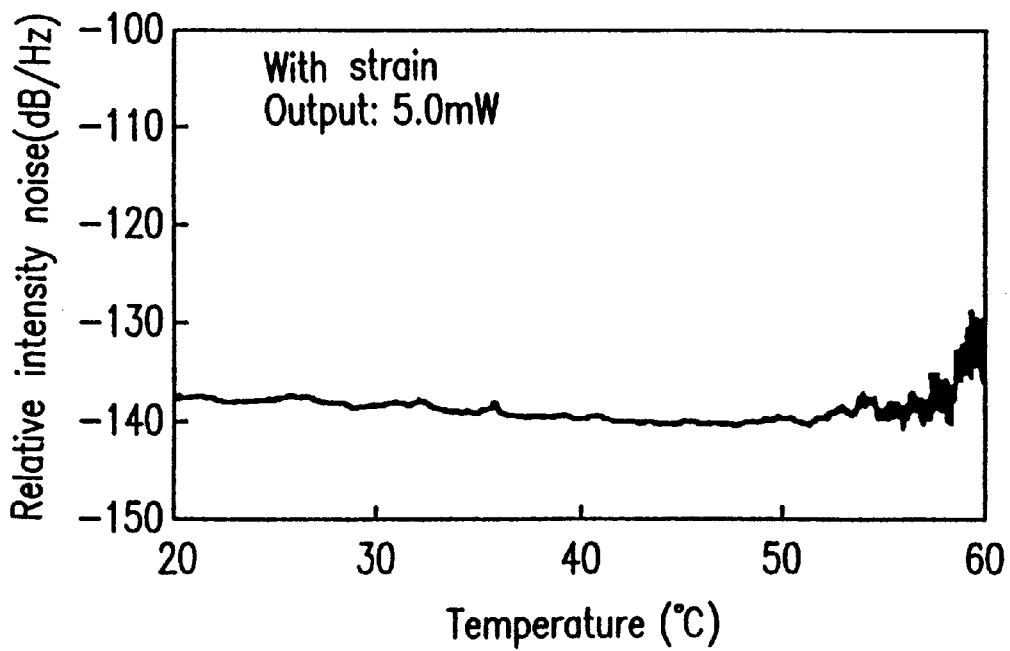

Moreover, FIG. 6A and FIG. 6B show relative intensity noise characteristics (changes in a relative intensity noise level with respect to a temperature change) respectively in the case where no strain is introduced into the saturable absorbing layer (without strain: FIG. 6A) and in the case where strain is introduced into the saturable absorbing layer (with strain: FIG. 6B). In general, self-pulsation characteristics are closely related to relative intensity noise characteristics, and when self-pulsation stops, the level of relative intensity noise increases. From the data shown in FIG. 6, in the case where strain is not introduced into the saturable absorbing layer, the relative intensity noise level is stable within the temperature range of up to about 45° C., and low noise is achieved within such a range. On the other hand, in the case where strain is introduced into the saturable absorbing layer, the relative intensity noise level is stable within a temperature range of up to about 55° C., and low noise is achieved within such a range.

Figure 7:
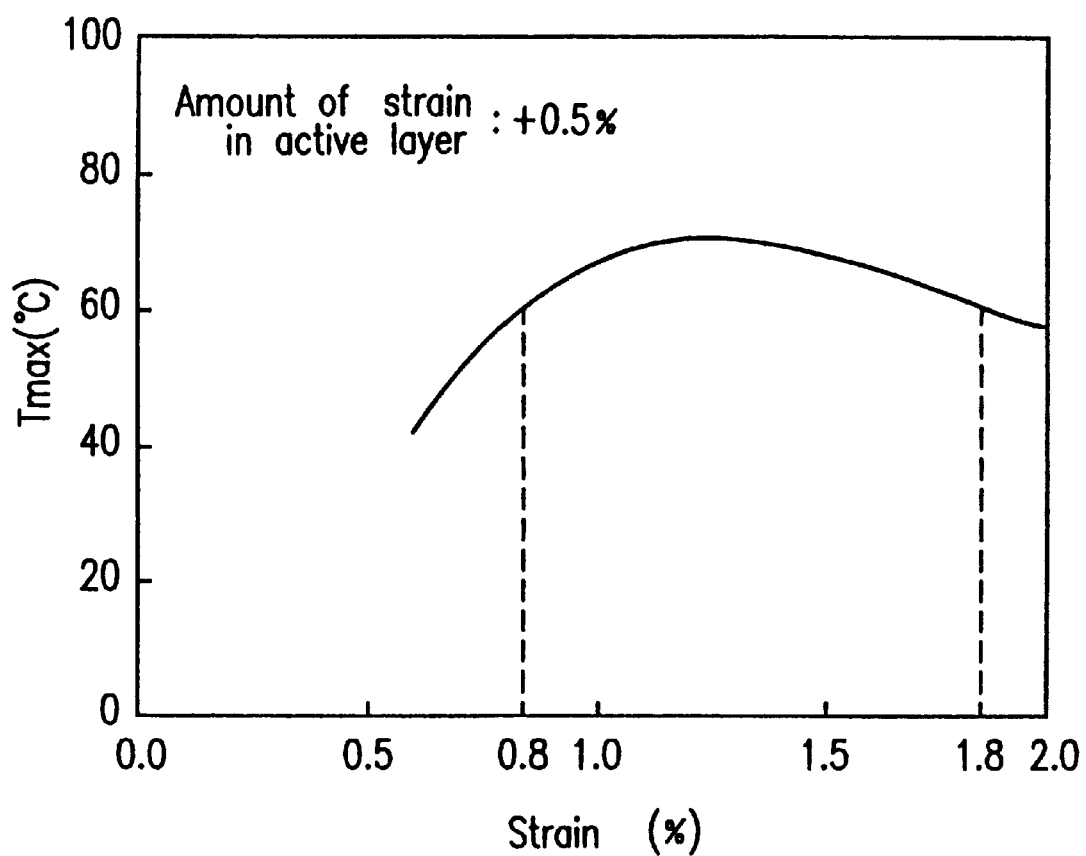
FIG. 7 is a diagram for explaining the optimum range of strain amount applied to the saturable absorbing layer in the semiconductor laser according to Example 1 of the present invention.

Furthermore, FIG. 7 is a view showing the relationship between strain amount introduced into the saturable absorbing layer and maximum temperature Tmax at which self-pulsation occurs in the case where the active layer has the strain level of about 0.5%.

From FIG. 7, in the case where a strain amount of about 0.8% to about 1.8% is introduced into the saturable absorbing layer, Tmax is about 60° C. or more. On the other hand, in the case where a strain amount applied to the saturable absorbing layer is about 0.8% or less, derivative gain cannot be sufficiently secured, resulting in unstable self-pulsation. In the case where a strain amount applied to the saturable absorbing layer is about 1.8% or greater, light absorption effect is excessively increased due to too large of a strain amount, resulting in an excessive increase in a threshold current or a driving current. As a result, the amount of carriers injected into the active layer is increased, thereby relatively reducing the effect of oscillation of carriers in the saturable absorbing layer. Consequently, self-pulsation becomes unstable.

Thus, the amount of strain applied to the saturable absorbing layer is a parameter which has a significant influence on self-pulsation characteristics. In order to obtain stable self-pulsation characteristics, there exists an optimum setting range.

According to the aforementioned description, since the amount of strain applied to the active layer is set to be about 0.5%, the amount of strain to be applied to the saturable absorbing layer is at least a value greater than about 0.5% by about 0.3%, i.e., about 0.8%, or more. On the other hand, in the case where the amount of strain applied to the active layer is approximately zero, the amount of strain to be applied to the saturable absorbing layer is at least about 0.3%, or more.

As described above, according to the present invention, a difference between the amount of strain applied to the saturable absorbing layer and the amount of strain applied to the active layer is set to be at least about 0.3%, or more. The upper limit of the strain amount applied to the saturable absorbing layer is preferably about 2.0% or less regardless of the strain amount in the active layer. This is because a problem such as the occurrence of dislocation within the saturable absorbing layer or the like arises in the case where strain in an amount greater than about 2.0% is applied, leading to reduction in reliability.

Although the saturable absorbing layer is provided in the p-type cladding layer in the aforementioned description, the saturable absorbing layer may be alternatively provided in the n-type cladding layer. In such a case, as described in this example, if an excessive level of strain is introduced into the saturable absorbing layer, the light absorption effect becomes too large, resulting in deteriorated operating characteristics. In the structure where the saturable absorbing layer is provided in the n-type cladding layer, it is also possible to obtain the effect of realizing stable self-pulsation or the like, in the same manner as in the aforementioned case where the saturable absorbing layer is provided in the p-type cladding layer, by defining the amount of strain to be introduced into the saturable absorbing layer as a difference with respect to the strain amount in the active layer so as to optimize the strain amount to be introduced into the saturable absorbing layer.

In association with the light confining function in the active layer, the saturable absorbing layer is preferably arranged in the order of the active layer, the saturable absorbing layer, and the light guiding layer. With such an arrangement, it is possible to further increase the light confining function in the saturable absorbing layer without reducing the light confining function of the active layer. Consequently, the effect of carrier overflow is reduced, and it is possible to realize stable self-pulsation characteristics even at a high temperature of about 60° C. or more.

According to the present example, the maximum self-pulsation temperature can be raised by about 10° C. by introducing strain into the saturable absorbing layer. At the same time, high output can be realized. As described above, the characteristics of the semiconductor laser of this example can be realized by employing the structure of the strained quantum-well saturable absorbing layer and the light guiding layer.

EXAMPLE 2

Figure 8:
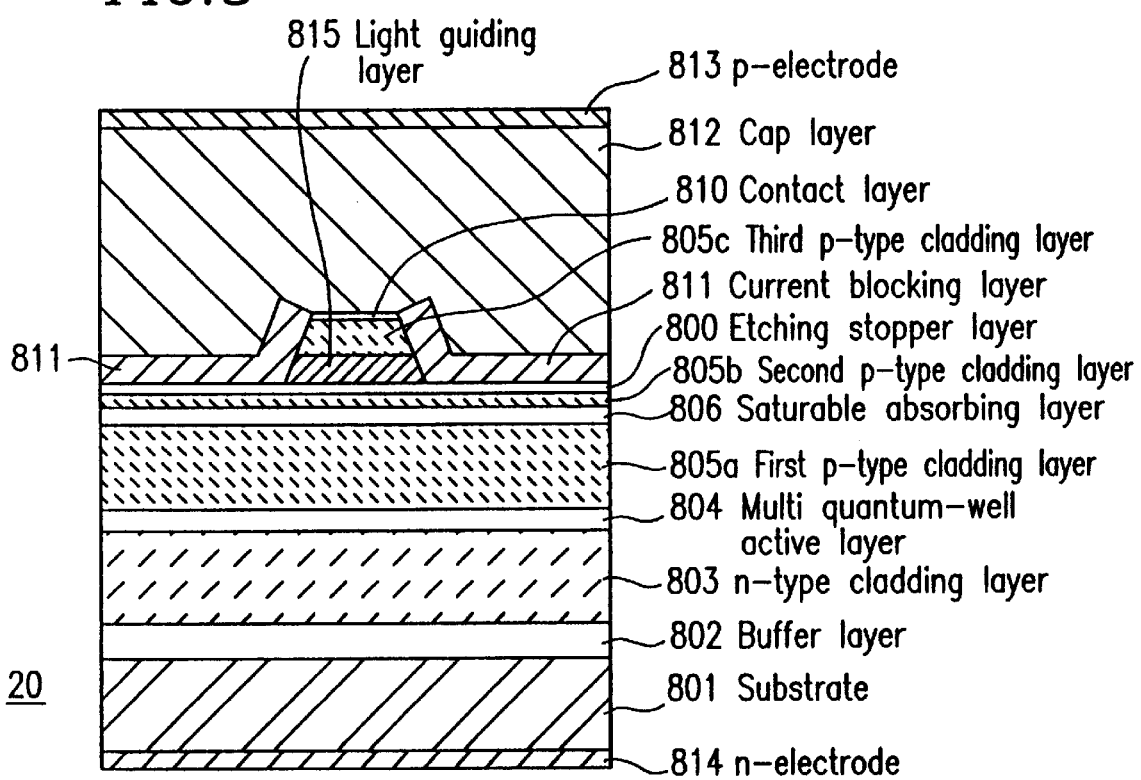
FIG. 8 is a cross-sectional view showing the structure of a semiconductor laser according to Example 2 of the present invention.

FIG. 8 is a cross-sectional view showing the structure of a semiconductor laser 20 having self-pulsation characteristics according to Example 2 of the present invention. In this example, by taking the arrangement of a light guiding layer into consideration, operating characteristics can be further improved.

In the semiconductor laser 20, an n-type InGaP buffer layer 802, an n-type AlGaInP cladding layer 803, a multi quantum-well active layer 804 containing an InGaP well layer and an AlGaInP barrier layer, a first p-type cladding layer 805a made of p-type AlGaInP, a p-type InGaP strained quantum-well saturable absorbing layer 806, a second p-type cladding layer 805b made of p-type AlGaInP, and a p-type InGaP etching stop layer 800 are sequentially formed on an n-type GaAs substrate 801. A p-type AlGaInP light guiding layer 815, a third p-type cladding layer 805c made of p-type AlGaInP, and a p-type InGaP contact layer 810 are sequentially formed in a ridge shape on the p-type etching stop layer 800. At both sides of the ridge, n-type GaAs current blocking layers 811 are formed. Moreover, a p-type GaAs cap layer 812 is formed on the p-type contact layer 810 and the n-type current blocking layers 811. A p-electrode 813 is formed on the cap layer 812, whereas an n-electrode 814 is formed on the bottom surface of the substrate 801.

Figure 9:
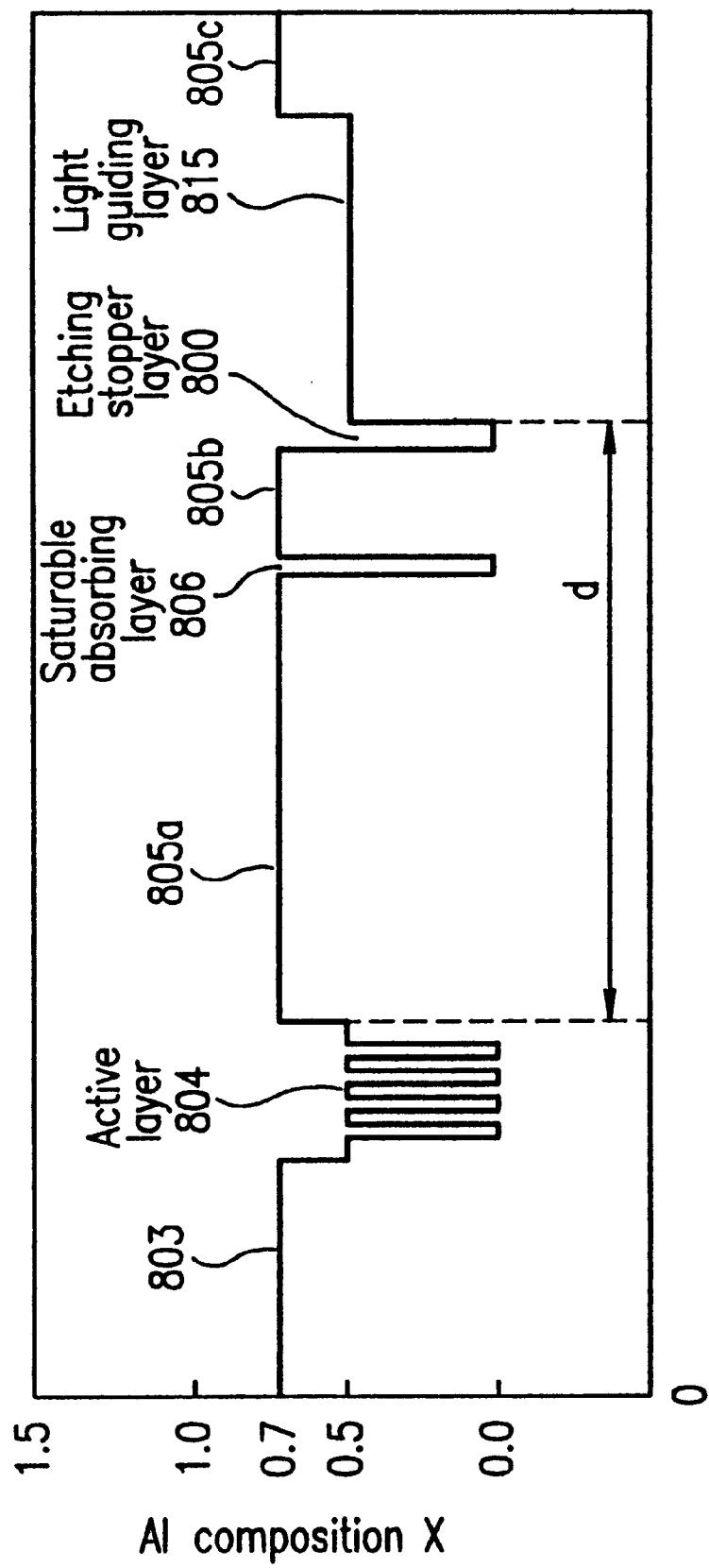
FIG. 9 is a diagram showing changes in Al composition in an active layer and the vicinity thereof in the semiconductor laser according to Example 2 of the present invention.

FIG. 9 shows changes in Al composition x of $(Al_xGa_{1-x})_{0.5}In_{0.5}P$ in the active layer 804 and the vicinity thereof in the semiconductor laser 20. As shown in the figure, the Al composition x in the n-type cladding layer 803 as well as the first, the second, and the third p-type cladding layers 805a, 805b, and 805c is set to be 0.7 in the semiconductor laser 20. Also, as can be seen from the figure, the light guiding layer 815 is disposed further away from the active layer 804 than the saturable absorbing layer 806.

Figure 10:
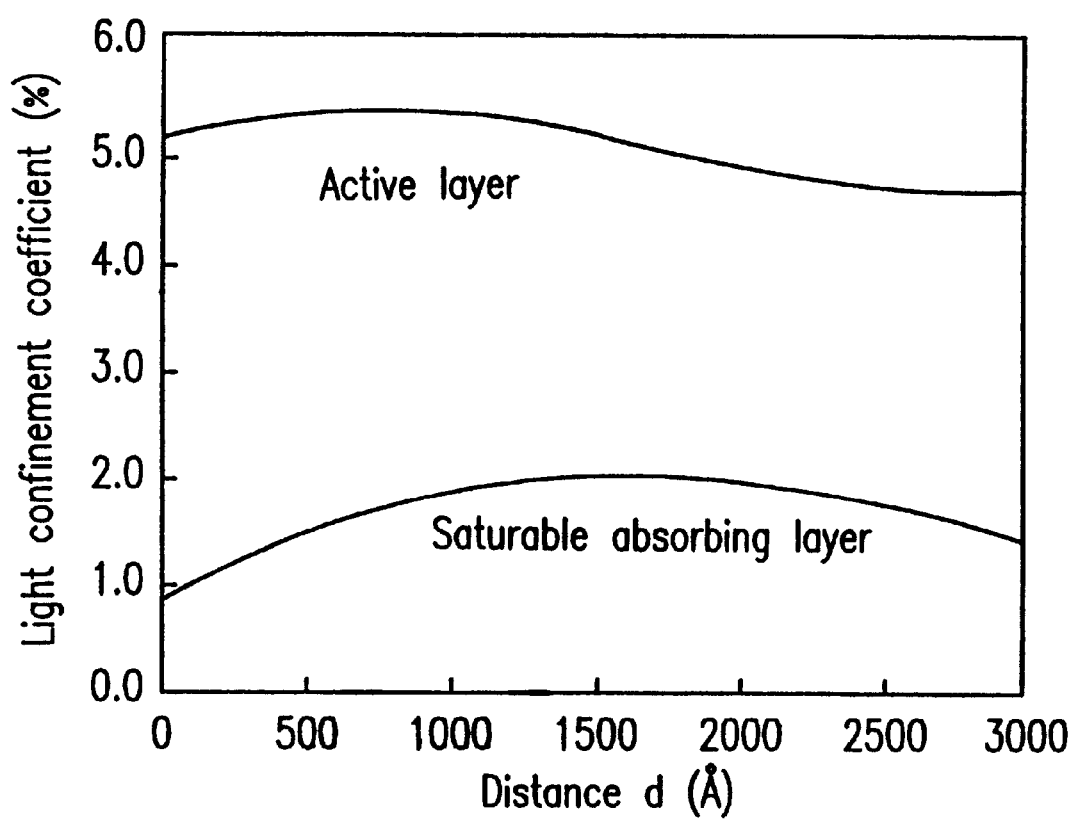
FIG. 10 is a diagram for showing the relationship between a distance between the active layer and a light confinement layer and light confinement coefficients in the active layer and a saturable absorbing layer.

FIG. 10 shows the dependency of a light confinement coefficient on the distance d between the active layer and the light guiding layer having a thickness of about 1000 angstroms (see FIG. 9) in each of the active layer and the saturable absorbing layer.

Self-pulsation characteristics are greatly influenced by the balance between the light confinement coefficient of the active layer and that of the saturable absorbing layer. In order to simply strengthen self-pulsation characteristics, a light confinement coefficient in the saturable absorbing layer should be increased. However, along with such an increase in the light confinement coefficient in the saturable absorbing layer, the light confinement coefficient in the active layer is inversely reduced, thereby causing adverse effects such as deterioration in the operating characteristics of the semiconductor laser itself, an increase in a driving current, or the like.

In association with such a point, according to Example 1, the light confinement coefficient in the saturable absorbing layer is especially increased by providing the light guiding layer between the active layer and the saturable absorbing layer. According to the further study made by the inventors of the present application, it has been revealed that the light confining function in the saturable absorbing layer can be further increased without reducing the light confining function in the active layer by providing the light guiding layer in the outer side (i.e., the side opposite to the active layer) of the saturable absorbing layer.

From FIG. 10, it can be seen that if the distance d between the active layer and the light guiding layer is in the range of about 1300 angstroms to about 2000 angstroms, the light confinement coefficient in the saturable absorbing layer becomes close to about 2.0%, i.e., there is an increased light confining function in the saturable absorbing layer. Such a setting for the distance d applies to the case where the light guiding layer is provided in the outer side of the saturable absorbing layer as described above, and corresponds to the structure of FIG. 8 previously referred to. Even when the light guiding layer is disposed away from the active layer in the manner as described above, the light confining function in the active layer is not excessively reduced.

Figure 11A:
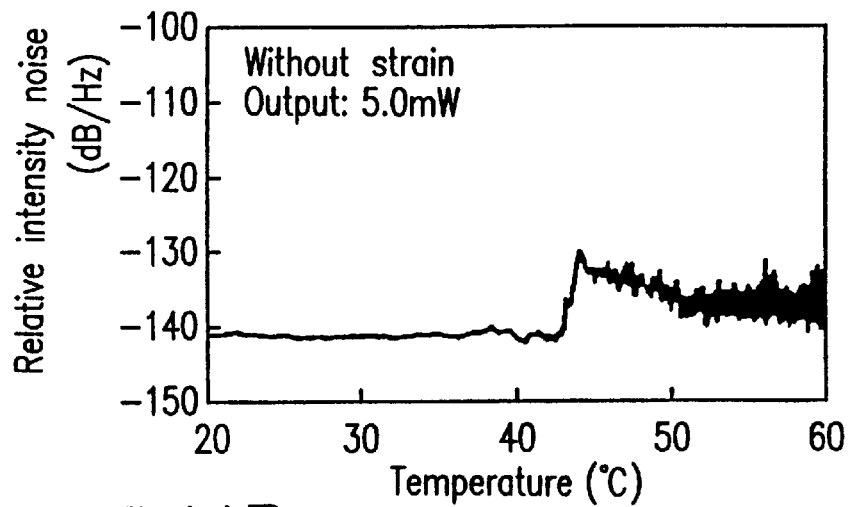
FIG. 11A, FIG. 11B, and FIG. 11C are diagrams for describing how the existence of compressive strain introduced into the saturable absorbing layer and optimization of the arrangement of an light guiding layer influence relative intensity noise characteristics of the semiconductor laser.
Figure 11B:
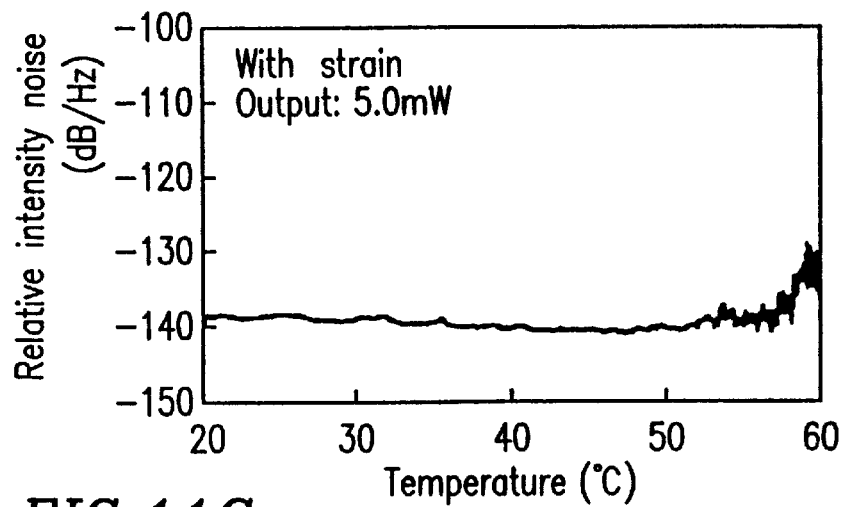
Figure 11C:
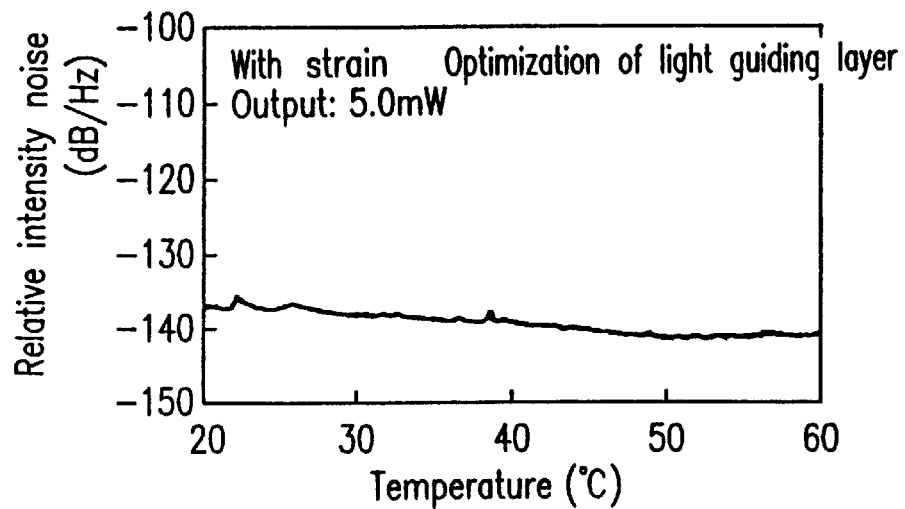

FIG. 11A, FIG. 11B, and FIG. 11C are diagrams for comparison regarding how the existence of strain introduced into the saturable absorbing layer and optimization for the arrangement of the light guiding layer influence relative intensity noise characteristics. FIG. 11A and FIG. 11B are the same as those previously shown as FIG. 6A and FIG. 6B, and show how the existence of strain introduced into the saturable absorbing layer influences relative intensity noise characteristics. On the other hand, FIG. 11C shows relative intensity noise characteristics in the case where strain is introduced into the saturable absorbing layer and the arrangement of the light guiding layer is optimized in the manner as previously described in the present example. As compared to the characteristics of FIG. 11B which correspond to the state where optimized arrangement of the light guiding layer is not performed, the characteristics of FIG. 11C which correspond to the state where optimized arrangement of the light guiding layer is performed are improved. Deterioration in relative intensity noise characteristics cannot be recognized over the temperature range of up to about 60° C.

When the distance between the active layer and the light guiding layer is set to be about 2000 angstroms or more, light confinement level in the active layer is reduced, thereby increasing an operating current. As a result, reliability of the semiconductor laser is adversely affected.

Figure 12:
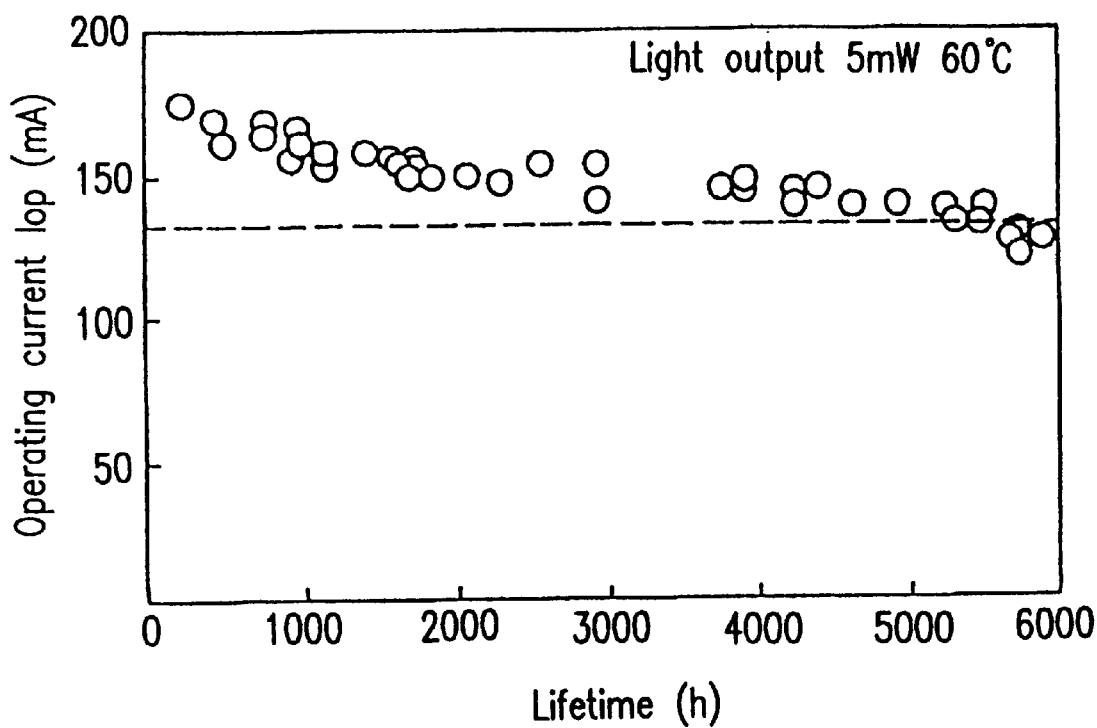
FIG. 12 is a diagram showing correlation between lifetime and operating current in the semiconductor laser according to Example 2 of the present invention.

FIG. 12 shows the relationship between lifetime and an operating current of a laser element in the semiconductor laser 20. From this figure, in order to secure about 5000 hours as the lifetime of the semiconductor laser, an operating current must be about 130 mA or less under operating conditions such as an operating temperature of about 60° C. and a light output of about 5 mW. On the other hand, according to the studies made by the inventors of the present application, when the distance between the active layer and the light guiding layer becomes about 2000 angstroms or more in the structure of the semiconductor laser 20, an operating current thereof exceeds about 130 mA. By taking this point into consideration, it is suitable for the light guiding layer to be disposed in a position away from the active layer by a distance of about 1300 angstroms to about 2000 angstroms.

Furthermore, in such a case, by providing the light guiding layer having a low Al composition not at a position between the active layer and the saturable absorbing layer but in an outer position than the saturable absorbing layer, the effect of carrier overflow is reduced. In other words, by arranging the light guiding layer at the outer side of the saturable absorbing layer, the area between the active layer and the saturable absorbing layer is occupied by a material having a high Al composition. Accordingly, carrier overflow, especially electron overflow, can be reduced. When the electron overflow is increased, light absorption effect by the saturable absorbing layer is reduced, thereby not being capable of maintaining stable self-pulsation. According to the arrangement (structure) of this example in which the position of the light guiding layer is optimized as described above, however, such a problem can be overcome, and it is possible to realize stable self-pulsation characteristics even in operations at a high temperature.

INDUSTRIAL APPLICABILITY

As described above, according to the present invention, by introducing a suitable level of compressive strain into the saturable absorbing layer, derivative gain is increased, thereby realizing the semiconductor laser having stable self-pulsation characteristics.

Moreover, according to the present invention, by employing the light guiding layer, and especially by arranging the active layer, the saturable absorbing layer, and the light guiding layer in this order, it is possible to obtain the semiconductor laser capable of realizing self-pulsation characteristics even when operated at a higher temperature.

What is claimed is:

1. A semiconductor laser comprising at least an active layer, and a saturable absorbing layer whose impurity concentration is at least about $1 \times 10^{18}$ cm$^{-3}$, wherein a compressive strain amount in the saturable absorbing layer is greater than a value of compressive strain in the active layer by about 0.3% or more.

2. A semiconductor laser according to claim 1, wherein the compressive strain is set so that a coefficient of light confinement into the saturable absorbing layer is about 3% or more.

3. A semiconductor laser according to claim 1, comprising current blocking layers, and a light guiding layer provided in a region interposed between the current blocking layers.

4. A semiconductor laser according to claim 2, wherein a light guiding layer whose upper and lower sides are interposed between cladding layers is provided between the active layer and the saturable absorbing layer.

5. A semiconductor laser according to claim 4, wherein the cladding layer is of p-type conductivity, and a thickness thereof is about 900 angstroms or more.

6. A semiconductor laser comprising at least an active layer, and a saturable absorbing layer whose impurity concentration is at least about $1 \times 10^{18}$ cm$^{-3}$, wherein a compressive strain amount in the saturable absorbing layer is set to a value such that the compressive strain amount is greater than a value of compressive strain in the active layer and a coefficient of light confinement into the saturable absorbing layer is about 3% or more.

7. A semiconductor laser according to claim 6, further comprising a light guiding layer, wherein the active layer, the saturable absorbing layer, and the light guiding layer are disposed in this order.

8. A semiconductor laser according to claim 6, wherein the active layer has a quantum-well structure; and the saturable absorbing layer has compressive strain in an amount greater than the value of compressive strain in the active layer by about 0.3% or more.

9. A semiconductor laser according to claim 6, wherein the saturable absorbing layer is of p-type conductivity, and is disposed in a p-type cladding layer.

10. A semiconductor laser according to claim 6, comprising current blocking layers, and a light guiding layer provided in a region interposed between the current blocking layers.

11. A semiconductor laser according to claim 9, further comprising a cladding layer provided between the active layer and the saturable absorbing layer, wherein a bandgap of the cladding layer is greater than a bandgap of the active layer and that of the saturable absorbing layer.

12. A semiconductor laser comprising at least an active layer, and a saturable absorbing layer whose impurity concentration is at least about $1 \times 10^{18}$ cm$^{-3}$, wherein a compressive strain amount in the saturable absorbing layer is greater than a value of compressive strain in the active layer.

13. A semiconductor laser according to claim 12, wherein the active layer has a quantum-well structure; and the compressive strain amount in the saturable absorbing layer is greater than the value of compressive strain in the active layer by about 0.3% or more.

14. A semiconductor laser comprising an active layer, a saturable absorbing layer, and a light guiding layer disposed in this order, wherein a distance d between the active layer and the light guiding layer is set so that a coefficient of light confinement into the saturable absorbing layer is about 2% or more, and wherein a compressive strain amount in the saturable absorbing layer is greater than a value of compressive strain in the active layer.

15. A semiconductor laser comprising at least an active layer, and a saturable absorbing layer whose thickness is about 150 angstroms or less, wherein a compressive strain amount in the saturable absorbing layer is greater than a value of compressive strain in the active layer.

16. A semiconductor laser according to claim 15, wherein an impurity concentration of the saturable absorbing layer is at least about $1 \times 10^{18}$ cm$^{-3}$.

17. A semiconductor laser according to claim 15, wherein:

the active layer has a quantum-well structure; and the compressive strain amount in the saturable absorbing layer is set to a value such that the compressive strain amount is greater than the value of compressive strain in the active layer and a coefficient of light confinement into the saturable absorbing layer is about 3% or more.

18. A semiconductor laser according to claim 15, wherein the saturable absorbing layer has compressive strain in an amount greater than the value of compressive strain in the active layer by about 0.3% or more.

* * * * *